(12) United States Patent
Pan et al.

(10) Patent No.: US 8,836,055 B2
(45) Date of Patent: Sep. 16, 2014

(54) MEMS STRUCTURES AND METHODS FOR FORMING THE SAME

(75) Inventors: Lung Yuan Pan, Hsin-Chu (TW); Lan-Lin Chao, Sindian (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 134 days.

(21) Appl. No.: 13/250,078

(22) Filed: Sep. 30, 2011

(65) Prior Publication Data
US 2013/0082338 A1      Apr. 4, 2013

(51) Int. Cl.
*H01L 31/115*          (2006.01)
(52) U.S. Cl.
USPC ............................ 257/420; 257/E29.324
(58) Field of Classification Search
USPC ................... 257/416–420, E29.324
See application file for complete search history.

(56) References Cited

U.S. PATENT DOCUMENTS

| | | | |
|---|---|---|---|
| 5,602,671 A | 2/1997 | Hornbeck | |
| 7,919,006 B2 | 4/2011 | Park et al. | |
| 2006/0203421 A1* | 9/2006 | Morris et al. | 361/277 |
| 2006/0267178 A1* | 11/2006 | Metzger | 257/698 |
| 2007/0082420 A1* | 4/2007 | Milne et al. | 438/48 |
| 2009/0064785 A1* | 3/2009 | Fukuda et al. | 73/514.32 |
| 2009/0111267 A1* | 4/2009 | Park et al. | 438/692 |

* cited by examiner

*Primary Examiner* — Matthew Reames
(74) *Attorney, Agent, or Firm* — Slater & Matsil, L.L.P.

(57) ABSTRACT

A device includes a micro-electro-mechanical system (MEMS) device, which includes a movable element and a fixed element. The movable element and the fixed element form two capacitor plates of a capacitor, with an air-gap between the movable element and the fixed element acting as a capacitor insulator of the capacitor. At least one of the movable element and the fixed element has a rugged surface.

6 Claims, 5 Drawing Sheets

MEMS STRUCTURES AND METHODS FOR FORMING THE SAME

BACKGROUND

Micro-electro-mechanical system (MEMS) devices may be used in various applications such as micro-phones, accelerometers, inkjet printers, etc. A commonly used type of MEMS devices includes a MEMS capacitor that has a movable element as a capacitor plate, and a fixed element as the other capacitor plate. The movement of the movable element causes the change in the capacitance of the capacitor. The change in the capacitance may be converted into the change in an electrical signal, and hence the MEMS device may be used as a micro-phone, an accelerometer, or the like. The movement of the movable element may also be used for squeezing the ink in an inkjet printer.

The distance between the movable element and the fixed element is typically small. During the manufacturing and the using of the MEMS devices, the movable element may stick to the fixed element, which is known as stiction in the art. When the stiction occurs, the respective MEMS devices fail.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A micro-electro-mechanical system (MEMS) device and the method of forming the same are provided in accordance with various embodiments. The intermediate stages of forming the MEMS device are illustrated. The variations of the embodiments are discussed. Throughout the various views and illustrative embodiments, like reference numbers are used to designate like elements.

Figure 1:
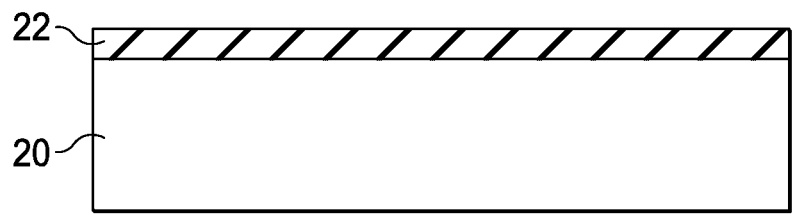
FIGS. 1 through 7 are cross-sectional views of intermediate stages in the manufacturing of a micro-electro-mechanical system (MEMS) device in accordance with various embodiments.

FIGS. 1 through 7 illustrate cross-sectional views of intermediate stages in the formation of a MEMS device in accordance with an embodiment. Referring to FIG. 1, substrate 20 is provided, and dielectric layer 22 is formed on substrate 20. In some embodiments, substrate 20 is a semiconductor substrate such as a silicon substrate, although other semiconductor materials such as silicon germanium, silicon carbon, III-V compound semiconductor materials, and the like may be used. Dielectric layer 22 may be a silicon oxide layer, which may be a thermal oxide formed by thermally oxidizing substrate 20.

Figure 2:
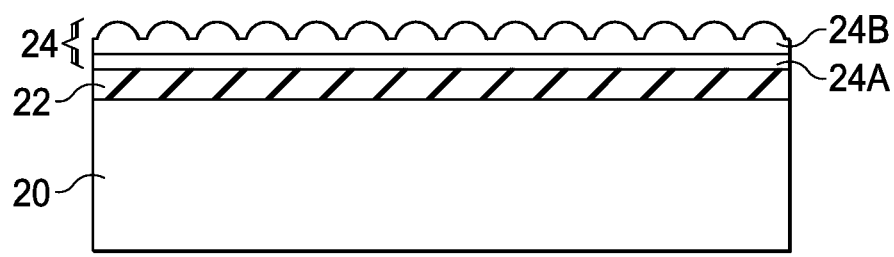

FIG. 2 illustrates the formation of sensing layer 24. In accordance with some embodiments, sensing layer 24 includes silicon-containing layer 24A and silicon-containing layer 24B. Each of silicon-containing layer 24A and silicon-containing layer 24B may be deposited using a chemical vapor deposition (CVD) method, wherein process gases such as silane, $PH_3$, $N_2$, and/or the like, may be used. Depending on the process conditions of the deposition and the subsequent annealing process (if an annealing step is performed), each of silicon-containing layers 24A and 24B may be a polysilicon layer or an amorphous silicon layer. In an exemplary embodiment, silicon-containing layer 24A is a polysilicon layer, while silicon-containing layer 24B is an amorphous layer. Alternatively, silicon-containing layers 24A and 24B are an amorphous silicon layer and a polysilicon layer, respectively. Both of silicon-containing layers 24A and 24B may also be polysilicon layers or amorphous silicon layers, in which embodiments, silicon-containing layers 24A and 24B may be formed using different process conditions or doped differently in order to adjust resistivity and/or stress therein.

Silicon-containing layer 24A and silicon-containing layer 24B may be formed using different process conditions such as different deposition temperatures, different flow rates of precursors, and the like. The process conditions and the subsequent annealing process in combination may cause silicon-containing layer 24A to be less rugged than silicon-containing layer 24B. In an exemplary embodiment, the formation of silicon-containing layer 24A includes a deposition temperature between about 520° C. and about 620° C., and/or a flow rate of $SiH_4$ between about 200 sccm and about 1,000 sccm. The formation of silicon-containing layer 24B includes a deposition temperature between about 520° C. and about 620° C., and/or a flow rate of $SiH_4$ between about 30 sccm and about 1,000 sccm.

In an embodiment, the formation of each, or either one, of silicon-containing layers 24A and silicon-containing layer 24A may be accompanied by an in-situ doping of a p-type or n-type impurity to increase the conductivity of the deposited film. Alternatively, during the formation of silicon-containing layer 24A and/or silicon-containing layer 24B, no in-situ doping is performed. If no in-situ doping is performed, after the deposition of either one, or both, of silicon-containing layers 24A and 24B, an implantation may be performed to implant p-type or n-type impurities into the respective silicon-containing layers 24A and 24B.

In an embodiment, silicon-containing layer 24A has a smaller roughness than silicon-containing layer 24B. Accordingly, an interface between silicon-containing layers 24A and 24B has a smaller roughness than the top surface of silicon-containing layer 24B. The roughness values of silicon-containing layers 24A and 24B may be expressed using root mean square (RMS) deviation of the surfaces of the respective silicon-containing layers 24A and 24B. The RMS values may be obtained by using atomic force microscope (AFM) to measure a specified surface area. In an exemplary embodiment, the RMS values may be obtained in a 3 μm×3 μm surface area and calculating the corresponding RMS value using the measured surface heights in this area. In some embodiments, the RMS value of the top surface of silicon-containing layer 24A is smaller than about 4 nm, while the RMS value of the top surface of silicon-containing layer 24B is greater than about 5 nm, greater than about 8 nm, or greater than about 10 nm. Throughout the description, the surfaces having the RMS values (for example, measured in a 3 μm×3 μm surface area) greater than 10 nm is referred to as a rugged surface, while the surfaces having the RMS values smaller than 10 nm is referred to as an un-rugged surface. Furthermore, the bump heights (which are the differences between the top surfaces of the bumps and the general planes of the surfaces) of the rugged surface are greater than about 40 nm, while the bump heights of the un-rugged surfaces may be smaller than about 10 nm. In some embodiments, silicon-containing layer 24B has a rugged surface, while silicon-containing layer 24A has an un-rugged surface.

It is noted that the rugged surface may be formed through adjusting the process conditions for depositing and/or annealing silicon-containing layer 24B, and may not be formed by lithography and etching processes that are performed after the formation of silicon-containing layer 24B. Accordingly, the bumps of the rugged surface of silicon-containing layer 24B are located with a random pattern, unlike the bumps and dimples that are formed using the lithography and etching processes.

Figure 3:
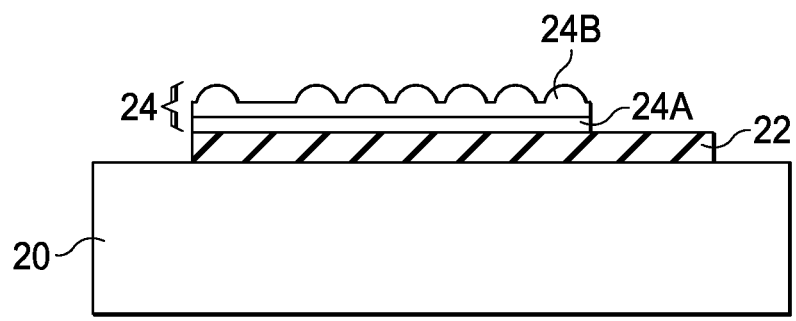
Figure 4:
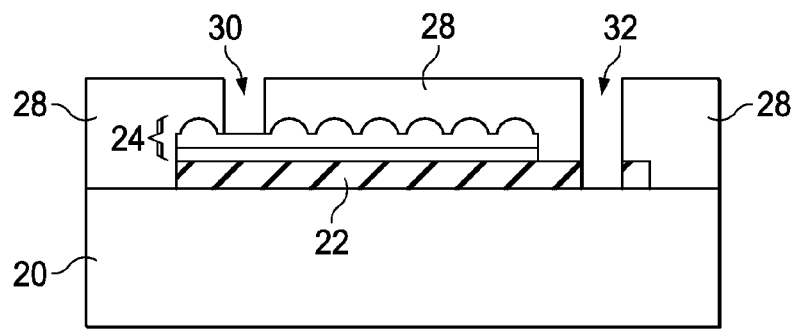

Referring to FIG. 3, sensing layer 24 and dielectric layer 22 are patterned. In an embodiment, a portion of dielectric layer 22 is exposed after the patterning. Next, as shown in FIG. 4, sacrificial oxide layer 28 is formed on sensing layer 24 and dielectric layer 22. Sacrificial oxide layer 28 may be formed of materials that have different etching characteristics than silicon and dielectric layer 22. In an embodiment, sacrificial oxide layer 28 comprises a material selected from the group consisting essentially of thermal silicon dioxide, low-pressure tetraethyl orthosilicate (LPTEOS) oxide, plasma enhanced tetraethyl orthosilicate (PETEOS) oxide, plasma enhanced oxide (PEOX), and combinations thereof. A patterning step is then performed to forming openings 30 and 32 in sacrificial oxide layer 28. Sensing layer 24 may be exposed through opening 30. Opening 32 may penetrate through dielectric layer 22, and hence substrate 20 may be exposed.

Figure 5:
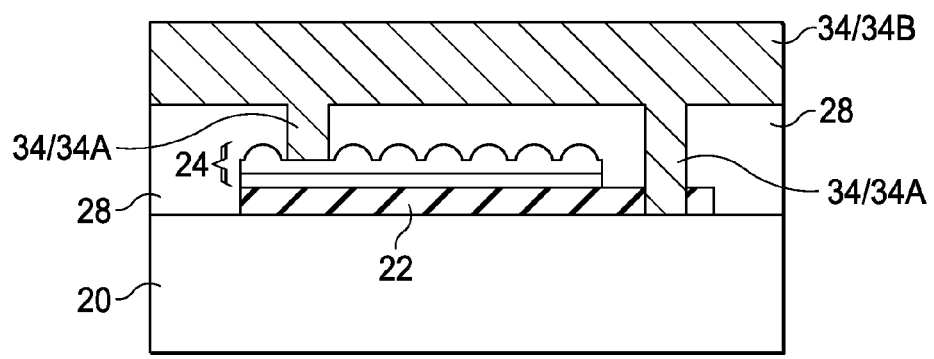

Next, as shown in FIG. 5, conductive material 34 is formed. Conductive material 34 includes portions 34A in openings 30 and 32, and portion 34B formed over sacrificial oxide layer 28. Conductive material 34 may comprise doped polysilicon or doped amorphous silicon, although other conductive materials such as metals may be used. A planarization may be performed to level the top surface of portion 34B.

Figure 6:
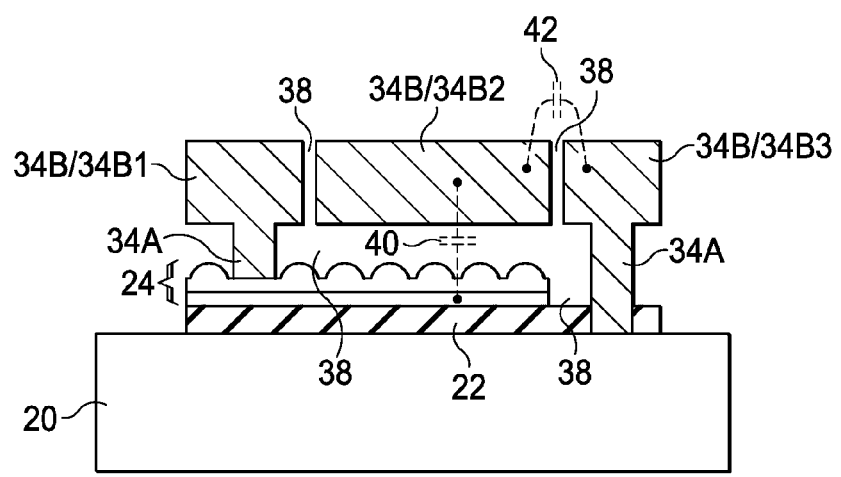

Next, as shown in FIG. 6, portion 34B of conductive material 34 is patterned to form openings 38, and sacrificial oxide layer 28 (refer to FIG. 5) is exposed through openings 38. Sacrificial oxide layer 28 is then removed through openings 38, so that air-gaps 38 are formed. In the resulting structure, air-gaps 38 act as the capacitor insulators for the resulting capacitor 40 and 42, which are MEMS devices. Capacitor 40 may include conductive feature 34B1 and the connecting sensing layer 24 as the fixed capacitor plate, which is also referred to as a fixed element throughout the description. Capacitor 42 may include conductive features 34B3 as the fixed capacitor plate. Feature 34B2 acts as the movable capacitor plate (element) of MEMS devices 40 and 42, and is sometimes referred to as a proof mass.

Figure 7:
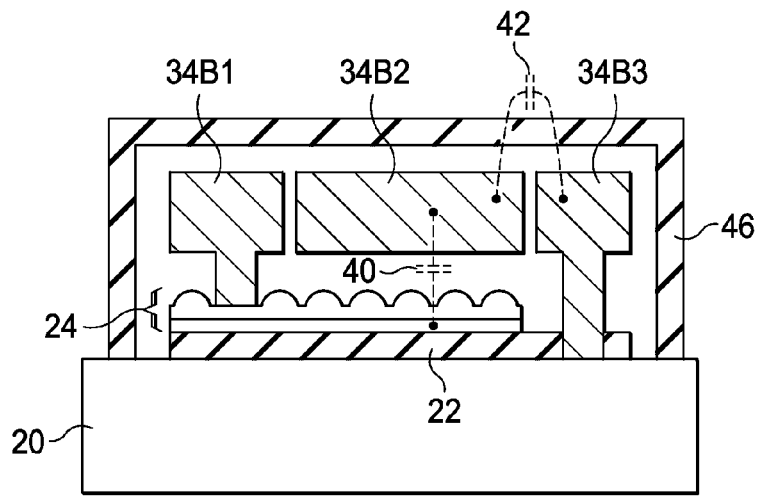

Referring to FIG. 7, cap 46 is bonded to the structure shown in FIG. 6, and MEMS devices 40/42 are protected by cap 46. Cap 46 may be a silicon-containing cap, although it may be formed of other materials including metals and dielectric materials.

FIG. 8 through 12 illustrate MEMS devices in accordance with alternative embodiments. Unless specified otherwise, the materials and formation methods of the components in these embodiments are essentially the same as the like components that are denoted by like reference numerals in the embodiments shown in FIGS. 1 through 7.

Figure 8:
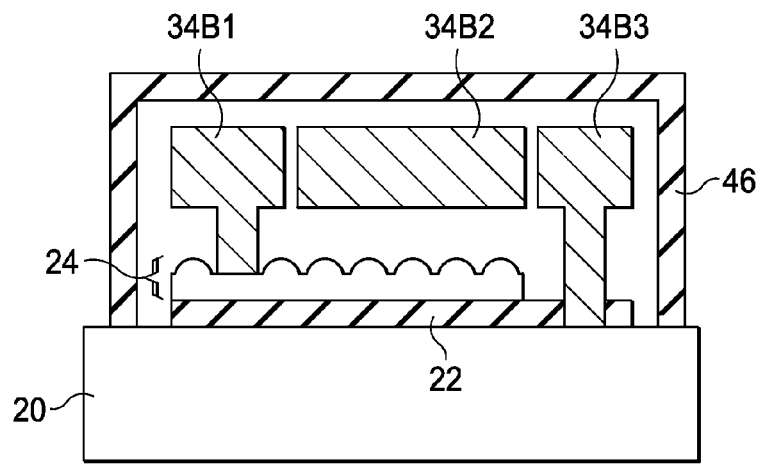
FIGS. 8 through 12 are MEMS devices in accordance with alternative embodiments, wherein rugged surfaces are formed to prevent stiction.

The embodiments shown in FIG. 8 are essentially the same as the embodiments shown in FIGS. 1 through 7, except sensing layer 24 includes a single layer formed using a single deposition process. The material and the process conditions of sensing layer 24 in accordance with these embodiments may be essentially the same that of silicon-containing layer 24B (not shown in FIG. 8, please refer to FIGS. 1 through 7). Accordingly, sensing layer 24 has a rugged surface essentially the same as the rugged surface of silicon-containing layer 24B.

Figure 9:
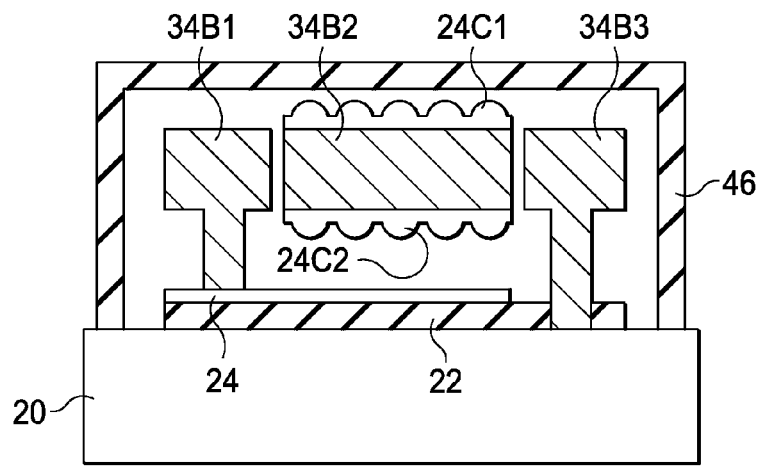

FIG. 9 illustrates MEMS devices in accordance with alternative embodiments. In these embodiments, the features having rugged surfaces are formed on movable element 34B2. For example, silicon-containing layers 24C (including 24C1 and 24C2) are formed on the top surface and/or the bottom surface of movable element 34B2, respectively, wherein silicon-containing layers 24C may comprise polysilicon, amorphous silicon, or the like, and may have rugged surfaces. In these embodiments, silicon-containing layers 24C2 and the conductive features 34B1, 34B2, and 34B3 may be pre-formed on an additional wafer, and then the additional wafer is bonded onto an sacrificial layer (similar to sacrificial layer as shown in FIG. 4). After the thinning of the other wafer to leave conductive features 34B1, 34B2, and 34B3, and silicon-containing layers 24C1, the sacrificial layer may be removed using essentially the same method as in FIG. 6. Silicon-containing layer 24C1 may then be deposited on conductive feature 34B2.

In the embodiments in FIG. 9, the material and the process conditions of sensing layer 24 in accordance with some embodiments may be essentially the same as that of sensing layer 24B (not shown in FIG. 9, please refer to FIGS. 1 through 7). Accordingly, sensing layer 24 has a rugged surface essentially the same as the rugged surface of silicon-containing layer 24B. Alternatively, the material and the process conditions of sensing layer 24 in accordance with some embodiments may be essentially the same the that of silicon-containing layer 24A (FIGS. 1 through 7). Accordingly, sensing layer 24 has an un-rugged surface essentially the same as the un-rugged surface of silicon-containing layer 24A.

Figure 10:
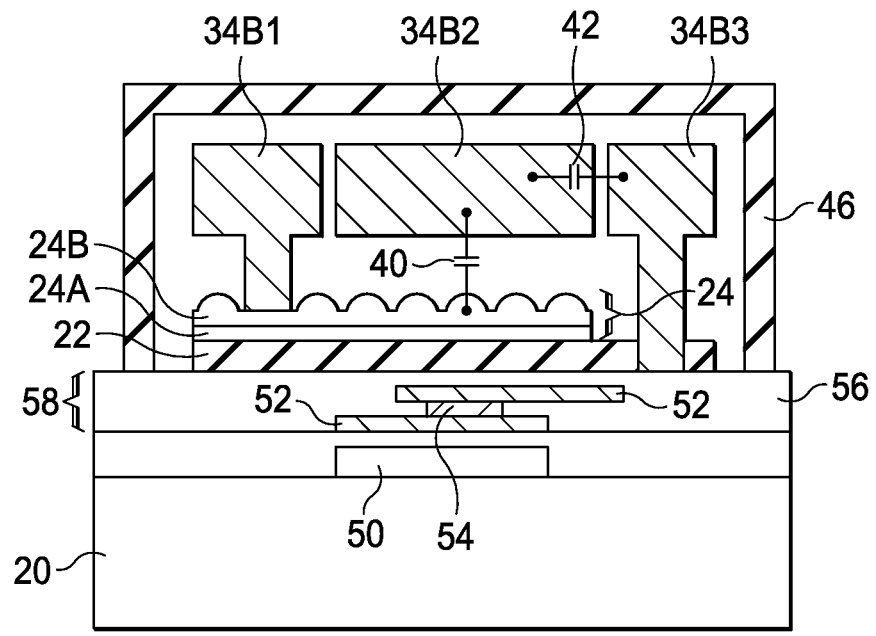
Figure 11:
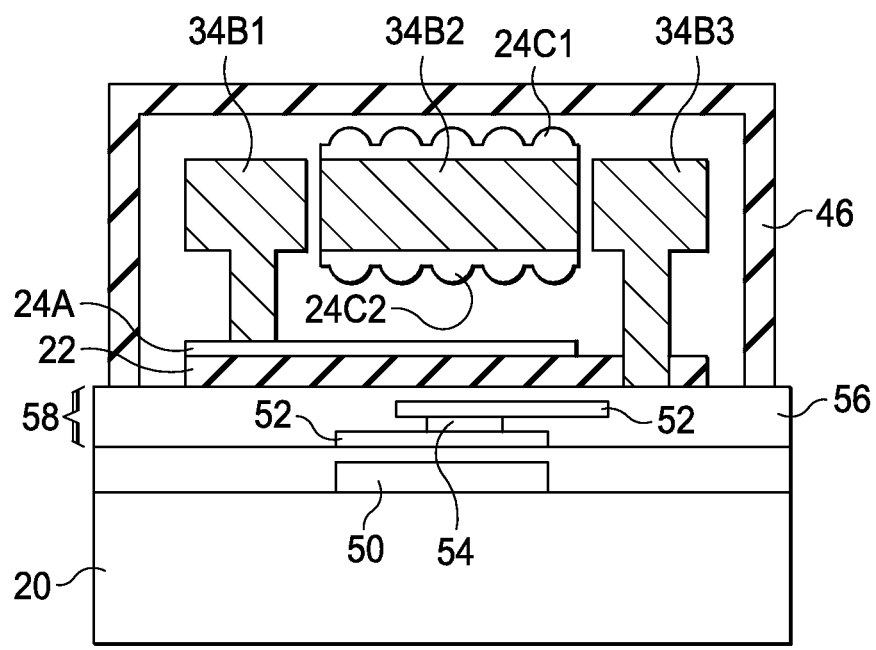
Figure 12:
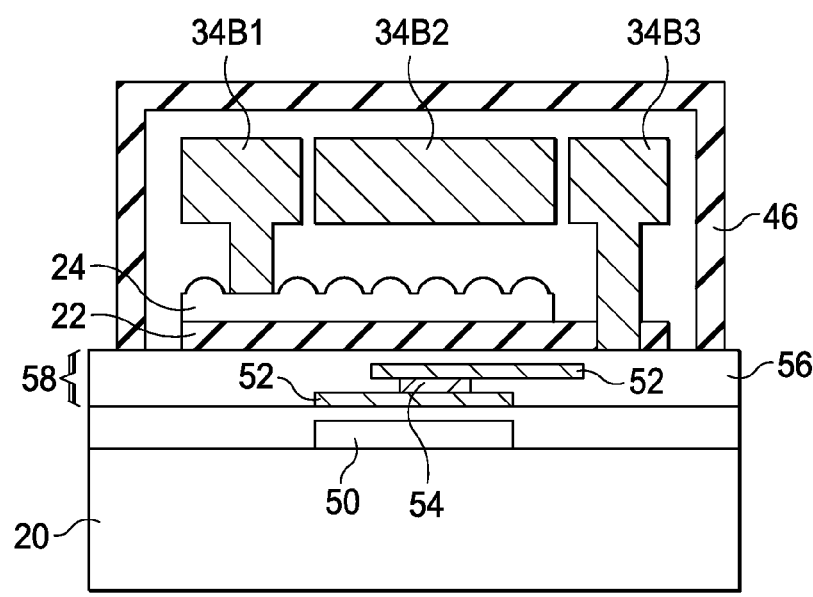

In the embodiments shown in FIGS. 7 through 9, MEMS devices are formed directly on substrate 20, with no metal layers therebetween. In alternative embodiments, the MEMS devices may be formed over a plurality of metal layers. For example, FIG. 10 illustrates an exemplary embodiment, wherein metal layers 58, which includes metal lines 52 and vias 54 formed in dielectric layers 56, are formed over substrate 20 and under MEMS devices 40 and 42. In these embodiments, substrate 20 may be a semiconductor substrate. Active devices such as complementary metal-oxide-semiconductor (CMOS) devices 50 may be formed on the surface of semiconductor substrate 20, wherein CMOS devices 50 are electrically coupled to metal layers 58. FIGS. 11 and 12 illustrate the embodiments similar to what are shown in FIGS. 8 and 9, respectively, except that metal layers 58 and CMOS devices 50 are formed over semiconductor substrate 20.

In the embodiments, by adjusting process conditions to form rugged surfaces for movable elements and/or fixed elements of the MEMS devices, the anti-stiction property of the movable and fixed elements of the MEMS devices is improved. The yield of the manufacturing process is improved. The embodiments do not need additional photo and etching steps for forming anti-stiction features such as dimples, bumps and/or stoppers. Therefore, the manufacturing cost is saved.

In accordance with embodiments, a device includes a MEMS device, which includes a movable element and a fixed element. The movable element and the fixed element form two capacitor plates of a capacitor, with an air-gap between the movable element and the fixed element acting as a capacitor insulator of the capacitor. At least one of the movable element and the fixed element has a rugged surface.

In accordance with other embodiments, a device includes a substrate and a MEMS device over the substrate. The MEMS device comprises a capacitor, which further comprises a movable element forming a first capacitor plate of the capacitor, a fixed element forming a second capacitor plate of the capacitor, and a silicon-containing layer as a portion of a first one of the movable element and the fixed element. The silicon-containing layer includes a rugged surface having an RMS deviation greater than about 10 nm. The rugged surface faces a second one of the movable element and the fixed element.

In accordance with yet other embodiments, a method includes forming a MEMS device over a substrate. The step of forming the MEMS device includes forming a movable element as a first capacitor plate of a capacitor, forming a fixed element as a second capacitor plate of the capacitor, and forming a silicon-containing layer as a surface portion of a first one of the movable element and the fixed element. The step of forming the silicon-containing layer includes adjusting process conditions to cause the silicon-containing layer to have a rugged surface having an RMS deviation greater than about 10 nm. The rugged surface faces a second one of the movable element and the fixed element.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a micro-electro-mechanical system (MEMS) device comprising:
   a movable element; and
   a fixed element, wherein the movable element and the fixed element form two capacitor plates of a capacitor, with an air-gap between the movable element and the fixed element acting as a capacitor insulator of the capacitor, and wherein the fixed element comprises:
      a first silicon-containing layer comprising a rugged surface having a root mean square deviation greater than about 10 nm; and
      a second silicon-containing layer adjoining the first silicon-containing layer, wherein one of the first silicon-containing layer and the second silicon-containing layer comprises polysilicon, and another one of the first silicon-containing layer and the second silicon-containing layer comprises amorphous silicon, and wherein a first surface of the first silicon-containing layer has a smaller roughness than the rugged surface, with the first surface of the first silicon-containing layer contacting a second surface of the second silicon-containing layer.

2. The device of claim 1, wherein the second silicon-containing layer comprises polysilicon, and wherein the first silicon-containing layer comprises amorphous silicon.

3. The device of claim 1, wherein the second silicon-containing layer comprises amorphous silicon, and wherein the first silicon-containing layer comprises polysilicon.

4. The device of claim 1, wherein the rugged surface comprises bumps, and wherein the bumps do not have repeated patterns.

5. The device of claim 1 further comprising:
a substrate; and
a dielectric layer over and contacting the substrate, wherein the fixed element has a bottom surface contacting a top surface of the dielectric layer.

6. The device of claim 1 further comprising:
a substrate;
a complementary metal-oxide-semiconductor (CMOS) device at a surface of the substrate; and
a plurality of metal layers over the CMOS device and under the MEMS device.

* * * * *